United States Patent [19]

Machida

[11] Patent Number: 4,740,750

[45] Date of Patent: Apr. 26, 1988

[54] RECEPTION SIGNAL PROCESSING APPARATUS IN NUCLEAR MAGNETIC RESONANCE DIAGNOSTIC APPARATUS

[75] Inventor: Yoshio Machida, Nishinasuno, Japan

[73] Assignee: Tokyo Shibaura Denki Kabushiki Kaisha, Kawasaki, Japan

[21] Appl. No.: 827,675

[22] Filed: Feb. 10, 1986

Related U.S. Application Data

[63] Continuation of Ser. No. 527,554, Aug. 29, 1983, abandoned.

[30] Foreign Application Priority Data

Aug. 28, 1982 [JP] Japan ................... 57-149776

[51] Int. Cl.[4] .................................... G01R 33/20
[52] U.S. Cl. ..................... 324/312; 324/309
[58] Field of Search ............ 324/307, 309, 311, 312, 324/313, 314, 318, 322; 364/574, 414

[56] References Cited

U.S. PATENT DOCUMENTS

| | | | |
|---|---|---|---|
| 3,124,741 | 3/1964 | Primas | 324/314 |
| 4,009,334 | 2/1977 | Sypula | 364/574 |
| 4,070,708 | 1/1978 | Smallcombe et al. | 324/307 X |
| 4,315,216 | 2/1982 | Clow et al. | 324/309 |
| 4,321,537 | 3/1982 | Yokokawa | 324/307 |
| 4,333,053 | 6/1982 | Harrison et al. | 324/307 |
| 4,370,892 | 2/1983 | Schmook | 364/574 |
| 4,390,840 | 6/1983 | Ganssen | 324/309 |
| 4,604,580 | 8/1986 | Sugiura et al. | 324/311 |
| 4,611,172 | 9/1986 | Takase | 324/309 |
| 4,612,504 | 9/1986 | Pelc | 324/309 |
| 4,616,182 | 10/1986 | Kramer et al. | 324/309 |

FOREIGN PATENT DOCUMENTS

| | | | |
|---|---|---|---|
| 0043565 | 1/1982 | European Pat. Off. | 364/574 |
| 2076540 | 12/1981 | United Kingdom | 364/309 |

OTHER PUBLICATIONS

Hinshaw, *Image Formation by Nuclear Magnetic Resonance: Sensitive Point Method*, Journal of Applied Physics, 1976.

Gruztner, *Coherent Broadband Decoupling*, Journal of Magnetic Resonance, pp. 3709–3721, vol. 47, No. 8.

Baines, *An Improved Picture Display for NMR Imaging*, 1976, vol. 9, pp. 809–811.

*Primary Examiner*—Stewart J. Levy
*Assistant Examiner*—Scott M. Oldham
*Attorney, Agent, or Firm*—Finnegan, Henderson, Farabow, Garrett & Dunner

[57] ABSTRACT

Reception signal processing apparatus in nuclear magnetic resonance diagnostic apparatus to display as an image the distribution of the spin density or relaxation time of specific atomic nuclei existing in an object utilizing nuclear magnetic resonance phenomena including a phase demodulator for phase demodulating a nuclear magnetic resonance signal evoked by nuclear magnetic resonance phenomena in accordance with two reference waves, the phases of which are different by 90°, an analog-to-digital convertor for digitalizing the separated two signals obtained by the phase demodulator, and a noise correction processor for eliminating the low frequency component noises included in the demodulated signals from the phase demodulator to obtain an image without artifacts.

2 Claims, 3 Drawing Sheets

RECEPTION SIGNAL PROCESSING APPARATUS IN NUCLEAR MAGNETIC RESONANCE DIAGNOSTIC APPARATUS

This application is a continuation of application Ser. No. 527,554, filed Aug. 29, 1983, now abandoned.

FIELD OF THE INVENTION

This invention relates to nuclear magnetic resonance diagnostic apparatus to display as an image the distribution of the spin density or relaxation time of specified atomic nuclei existing in an object utilizing nuclear magnetic resonance (NMR) phenomena, and more particularly to reception signal processing apparatus to process the received NMR signals at the preliminary stage of image formation.

BACKGROUND OF THE INVENTION

In nuclear magnetic resonance diagnostic apparatus, NMR signals are detected to obtain an image which reflects the spin density, relaxation time constant or the like of specific atomic nuclei within an object.

Designating each of those signals F(t), F(t) may be basically represented by the following formula (1):

$$F(t) = \int_{-\infty}^{\infty} p(w) e^{iwt} dw \quad (1)$$

where p(w) is the frequency spectrum of the signal (real number value function).

w is angular frequency.

t is time.

However, since the actually observed signals F(t) include an offset component B(t) of low frequency added to the aforementioned F(t), it may be represented by the following formula (2):

$$\tilde{F}(t) = F(t) + B(t) \quad (2)$$

Here, B(t) is represented by the following formula (3):

$$B(t) = \int_{-\delta}^{\delta} \Delta(w) e^{iwt} dw \quad (3)$$

where
- δ is a small positive number
- Δ(w) is an offset component (real number value function)

However, for example, in Fourier transforming the signal $\tilde{F}(t)$ which has a real part as shown in FIG. 1(B) and imaginary part as shown in FIG. 1(C), the resultant frequency spectrum $\tilde{P}(w)$ will be an abnormal wave form which has a spike at its central portion, as shown in FIG. 1(D). This is because the offset component B(t) of low frequency has been included in the signal. It is desirable to obtain the noiseless frequency spectrum P(w) (being also called projection data) as shown in FIG. 1(A). If performing image reconstruction utilizing the projection data of such abnormal wave form as in FIG. 1(D), radiating artifacts $A_f$ will appear from the image center portion (FIG. 1(E)).

The addition of the offset of low frequency resulting in artifacts $A_f$ comes about as an alteration in time as a property of the hardware. It also results from the deterioration of analog-to-digital conversion in case of processing with a computer. However, it is difficult to completely eliminate such an offset component B(t) of low frequency which is included in the detected signal F(t) with hardware alone.

SUMMARY OF THE INVENTION

It is therefore an object of this invention to provide reception signal processing apparatus in nuclear magnetic resonance diagnostic apparatus, in case of phase demodulating a nuclear magnetic resonance signal in accordance with two reference waves which have the same frequency as the resonance signal and are different from one another by 90°, to possibly eliminate the low frequency component noise included in the demodulated signals and to obtain an image without the artifacts due to such noise.

Briefly, this and other objects are achieved in accordance with a first aspect of the invention by reception signal processing apparatus in nuclear magnetic resonance diagnostic apparatus to display as an image the distribution of the spin density or relaxation time of specific atomic nuclei existing in an object utilizing nuclear magnetic resonance phenomena comprising means for phase demodulating a nuclear magnetic resonance signal evoked by nuclear magnetic resonance phenomena in accordance with two reference waves for which the phases differ from one another by 90°, means for digitizing the two signals obtained by the phase demodulating means, and noise correction processing means for eliminating the low frequency component noises included in the demodulated signals to obtain an image without artifacts.

DESCRIPTION OF THE PREFERRED EMBODIMENTS

Processing methods to perform image reconstruction on the basis of the detected nuclear magnetic resonance (NMR) signal F(t) are, for example, as follows:

(1) obtaining projection data by Fourier transforming the NMR signal F(t) and then obtaining filtered projection data by filter processing a number of sets of projection data in a variety of directions around an object, for example, by a convolution method; and (2) obtaining filtered projection data by Fourier transforming after filter processing the NMR signal F(t).

Using processing method (1) the present invention eliminates noise due to a low frequency component within the projection data after Fourier transformation. On the other hand, if processing method (2) is used, the present invention contemplates eliminating noise due to a low frequency signal within the NMR signal F(t) before Fourier transformation.

Figure 1:
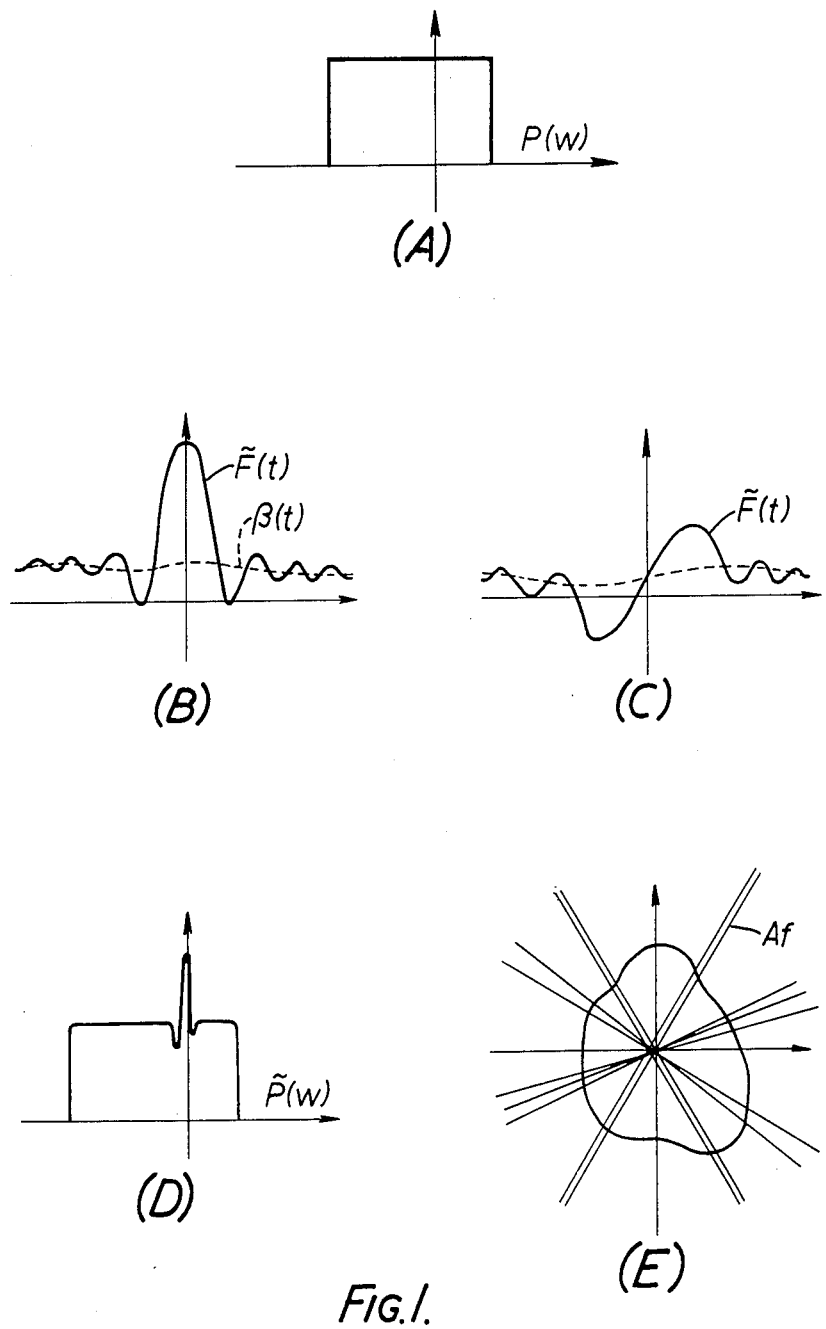
FIG. 1(A) is a wave form chart illustrating the ideal frequency spectrum P(w) of an NMR signal.
FIG. 1(B) is a wave form chart illustrating the real part signal obtained by phase demodulating the observed NMR signal.
FIG. 1(C) is a wave form chart illustrating the imaginary part signal obtained by phase demodulating the observed NMR signal.
FIG. 1(D) is a wave form chart illustrating the frequency spectrum P(w) obtained by Fourier transforming the signal obtained after phase demodulation.
FIG. 1(E) is a schematic illustration designating an image including artifacts.
Figure 2:
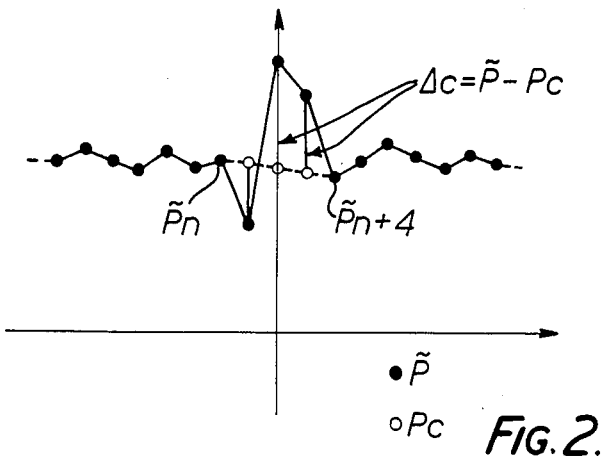
FIG. 2 is a graphical representation illustrating the correction amount $\Delta_c$ due to linear interpolation.

In the case of the above method (2), it is impossible to directly eliminate the noise due to the low frequency from the NMR signal $\widetilde{F}(t)$. Accordingly, first only the signals in the NMR signal $\widetilde{F}(t)$ which provide the spike on the frequency spectrum as obtained by Fourier transformation are selected. By Fourier transforming the selected signals, the correction amount $\Delta_c$ is found on the basis of the data at the ends of the spike portion in the frequency spectrum, as shown in FIG. 2. Subtracting an amount B(t), obtained by inverse Fourier transforming the correction amount $\Delta_c$, from the NMR signal $\widetilde{F}(t)$, it is possible to find an NMR signal F(t) without an offset component of low frequency.

This is shown as follows:

$$\Delta_c(k) = \widetilde{P}(k) - P_c(k) \quad (4)$$

where k is an integer near rotation angle w=0. Then, $$F_c(j) = F(j) \frac{1}{N} \Sigma_k \Delta c(k) e^{\frac{i 2\pi jk}{N}} \quad (5)$$

where N is a point number of digital Fourier transformation.

An embodiment of the invention in which the aforementioned principle is incorporated will be discussed referring to the figures.

Figure 3:
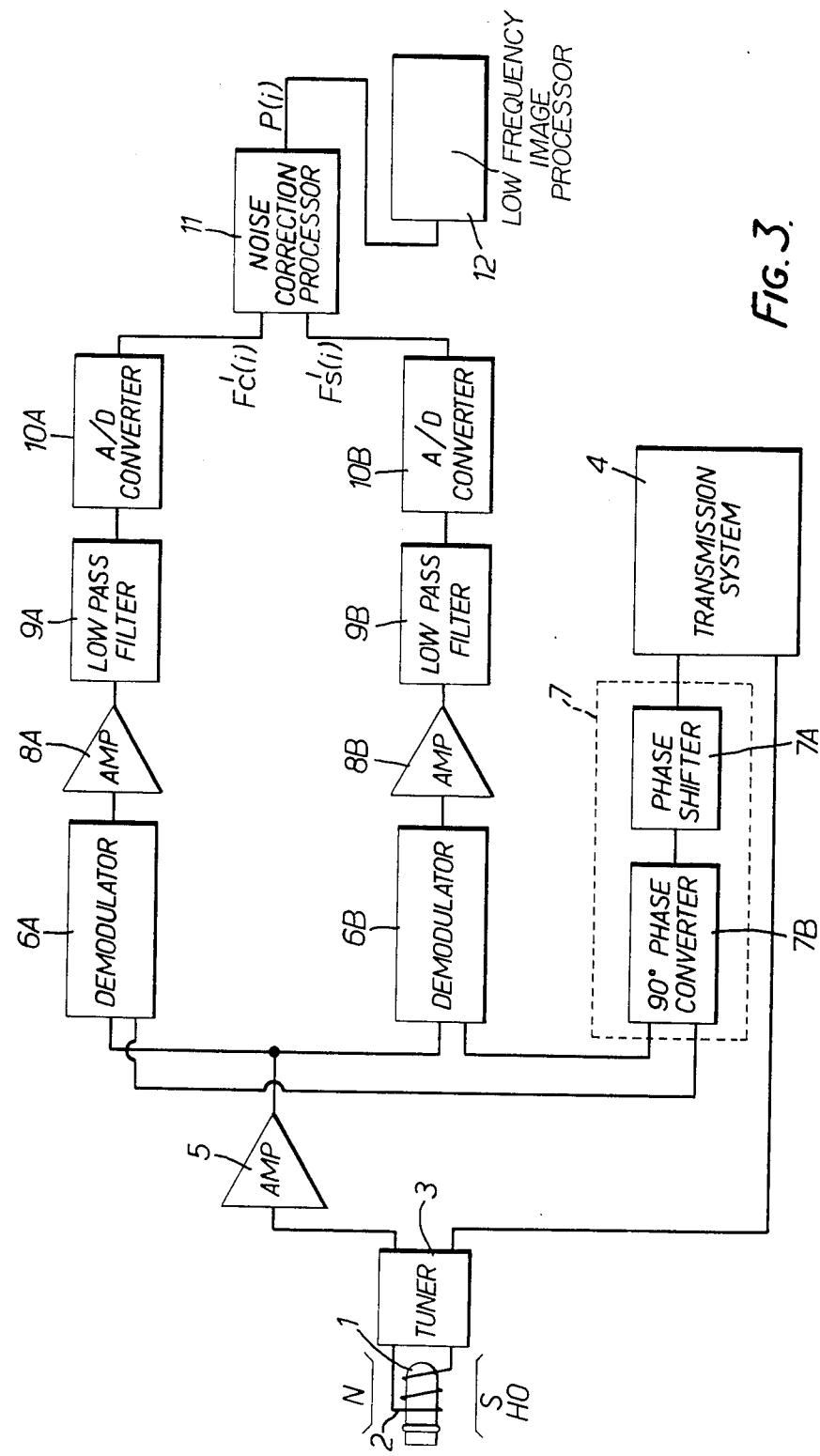
FIG. 3 is a schematic block diagram illustrating the construction of an embodiment of this invention.

In FIG. 3, an object 1 is placed in a static magnetic field Ho and also in the field of a transmission and reception signal coil 2 which generates a magnetic field perpendicular to the static magnetic field Ho. A tuner 3 operates to select an electromagnetic wave of specific frequency from the electromagnetic signals issued from transmission system 4, to be applied as an excitation pulse to coil 2, the frequency being the resonant frequency of the specific atomic nucleus such as hydrogen within the object 1. Amplifier 5 amplifies the NMR signal received by the coil 2 to deliver it to two phase demodulators 6A and 6B. A reference signal generator 7 being provided with a phase shifter 7A and a 90° phase converter 7B, generates two kinds of reference waves, each having the same frequency as the NMR signal but with phases differing from each other by 90°. The generated reference waves are supplied to the phase demodulators 6A and 6B, respectively.

The two phase demodulators 6A and 6B phase demodulate the NMR signal with the reference wave to separately generate two analog signals $\widetilde{F}(t)$ (real part and imaginary part). The separated signals of $\widetilde{F}(t)$ are amplified by amplifiers 8A and 8B, the high frequency component of the signals is blocked by low pass filters 9A and 9B and the signals are digitized by analog-to-digital (A/D) converters 10A and 10B, respectively. These digitized signals $\widetilde{F}(t)$ are applied to a noise correction processor 11.

This noise correction processor 11 is a digital calculation apparatus used to eliminate the influence of the low frequency noise component when producing filtered projection data on the basis of the digitized signals $\widetilde{F}(t)$. The processor 11 operates to eliminate the influence of the low frequency noise component in accordance with the flow chart of FIG. 4, when the processing method for the signals $\widetilde{F}(t)$ uses the above discussed method (1). It also operates to eliminate the influence of the low frequency component in accordance with the flow chart of FIG. 5, when the processing method for the signals $\widetilde{F}(t)$ uses the method (2) discussed above.

Figure 4:
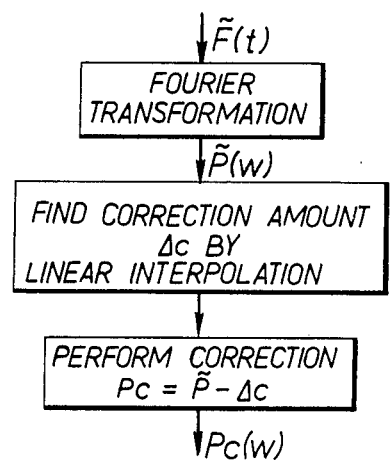
FIGS. 4 and 5 are flow charts illustrating different processing methods of noise correction, respectively.

As shown in FIG. 4, the signals $\widetilde{F}(t)$ are Fourier transformed and a correction amount $\Delta_c$ is found by linear interpolating on the basis of the data (which are represented by $\widetilde{P}n$ and $\widetilde{P}n+4$, respectively) at the ends of the data which constitute the spikes in the resultant projection data $\widetilde{P}(w)$. The correction of the projection data $\widetilde{P}(w)$ then is performed by subtracting that correction amount $\Delta_c$ from the data constituting the spike in the projection data $\widetilde{P}(w)$. After that, filtered projection data are obtained by filter processing the corrected projection P(w), for example, utilizing a convolution method.

Figure 5:
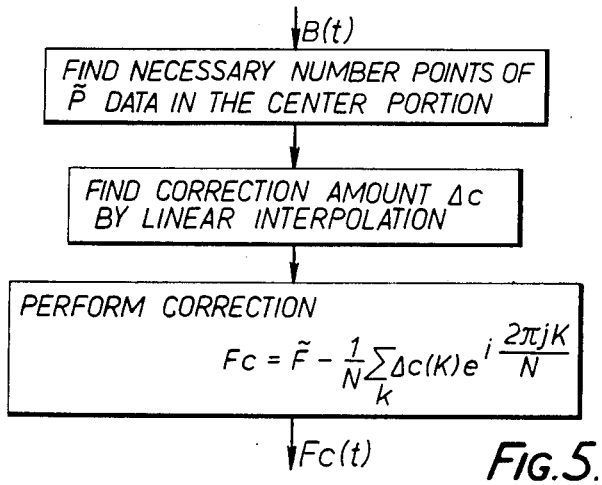

In the case of the second processing method, as shown in FIG. 5, the signal $\widetilde{B}(t)$ is selected which corresponds to the data constituting the spike in the projection data $\widetilde{P}(w)$ (which would be obtained by Fourier transformation) and also to the data at the ends of the spike (which are represented by $\widetilde{P}n$ to $\widetilde{P}n+4$). $\widetilde{P}n$ to $\widetilde{P}n+4$ are found by Fourier transforming that selected signal B(t). A correction amount $\Delta_c$ is found by linear interpolating between $\widetilde{P}n$ and $\widetilde{P}n+4$. Utilizing the correction amount $\Delta_c$, a signal Fc(t) without low frequency component noise is found by correcting the signal $\widetilde{F}(t)$ in accordance with the formula (5). Filter processing the signal Fc(t), filtered projection data are obtained by Fourier transforming that filtered Fc(t) signal.

A low frequency image processor 12 (FIG. 3) receives the filtered projection data which are found in accordance with one of the aforementioned processing methods within the noise correction processor 11. Processor 12 thus performs an image reconstruction on the basis of the received data to produce an image signal relating to the image that reflects the spin density, relaxation time, etc., of specific atomic nuclei such as hydrogen.

By the construction as described above, it is possible to reconstruct an image without artifacts caused by noise due to an offset component of low frequency which are eliminated from the filtered projection data.

It will be apparent, to those skilled in the art, that modifications and variations can be made in the preferred embodiment disclosed herein without departing from the scope or the spirit of the invention. For example, the invention enables one to adapt to NMR apparatus adopting other various image reconstruction methods, for example, a Fourier transformation method.

What is claimed is:

1. Reception noise signal processing apparatus in nuclear resonance diagnostic apparatus to display as an image the distribution of a detected nuclear resonance signal F(t) of specified atomic nuclei existing in an object utilizing nuclear magnetic resonance phenomena, the reception noise signal processing apparatus comprising:

means for phase demodulating a nuclear magnetic resonance signal produced by nuclear magnetic resonance phenomena in accordance with two reference waves having phases differing from one another by 90° to produce two signals having low frequency noise components;

means for filtering said noise components;

means for digitizing each of the two signals obtained by said phase demodulating means; and noise correction processing means for eliminating the low frequency noise component included in said digitized demodulated signals by Fourier transform processing said digitized demodulated signals to obtain correction amounts based on low frequency noise components in the transformed demodulated signals and subtracting from said transformed demodulated signals said correction amounts, whereby said signals are processable to obtain an image without artifacts.

2. Reception noise signal processing apparatus in nuclear resonance diagnostic apparatus to display as an image the distribution of a detected nuclear resonance signal F(t) of specified atomic nuclei existing in an object utilizing nuclear magnetic resonance phenomena, the reception noise signal processing apparatus comprising:

means for phase demodulating a nuclear magnetic resonance signal produced by nuclear magnetic resonance phenomena in accordance with two reference waves having phases differing from one another by 90° to produce two signals having low frequency noise components;

means for filtering said noise components;

means for digitizing each of the two signals obtained by said phase demodulating means; and noise correction processing means for eliminating the low frequency noise component included in said digitized demodulated signals by Fourier transform processing said digitized demodulated signals to obtain first correction amounts based on low frequency noise components in the transformed demodulated signals, inverse Fourier transform processing said first correction amounts to obtain second correction amounts, subtracting said second correction amounts from said digitized demodulated signals to obtain corrected demodulated signals, and Fourier transform processing said corrected demodulated signals, whereby said signals are processable to obtain an image without artifacts.

* * * * *